(12) United States Patent
Wang et al.

(10) Patent No.: US 6,544,695 B2
(45) Date of Patent: Apr. 8, 2003

(54) PHOTOMASK SET FOR PHOTOLITHOGRAPHIC OPERATION

(75) Inventors: Li-Ming Wang, Taoyuan (TW); Kao-Tsair Tsai, Kaohsiung (TW)

(73) Assignee: Winbond Electronics Corp., Hsinchu (TW)

( * ) Notice: Subject to any disclaimer, the term of this patent is extended or adjusted under 35 U.S.C. 154(b) by 91 days.

(21) Appl. No.: 09/833,124

(22) Filed: Apr. 11, 2001

(65) Prior Publication Data

US 2002/0150841 A1 Oct. 17, 2002

(51) Int. Cl.⁷ .................................................. G03F 9/00
(52) U.S. Cl. ........................................................... 430/5
(58) Field of Search ............................................. 430/5

(56) References Cited

U.S. PATENT DOCUMENTS 6,337,162 B1 * 1/2002 Irie ................................ 430/5

* cited by examiner

*Primary Examiner*—Christopher G. Young
(74) *Attorney, Agent, or Firm*—J. C. Patents

(57) ABSTRACT

A photomask set and a photolithographic operation suitable for forming a desired pattern on a photoresist layer. The photomask set includes a plurality of photomasks each having a different pattern thereon. To form an overall pattern on the photoresist layer, each photomask is used in turn in a multi-exposure operation.

15 Claims, 4 Drawing Sheets

PHOTOMASK SET FOR PHOTOLITHOGRAPHIC OPERATION

BACKGROUND OF THE INVENTION

1. Field of Invention

The present invention relates to a processing method and equipment for forming semiconductor devices. More particularly, the present invention relates to a photomask set for photolithographic operation.

2. Description of Related Art

In order to pack more semiconductors in a silicon chip, resolution in a photolithographic operation must be increased. According to Rayleigh's theory, the resolution of a pattern after a light exposure can be represented by the formula:

$$R(\text{resolution}) = K_1 \times \lambda / NA \quad (1)$$

where $\lambda$ is the wavelength of the light source used in the light exposure, NA is the numerical aperture of the light-exposing instrument, and $K_1$ is a process-related parameter whose value depends on the photoresist material, thickness of the photoresist layer and method of exposure. Therefore, aside from using a shorter wavelength light source, another means of increasing pattern resolution is to lower the value of $K_1$.

However, as $K_1$ is lowered to a value below 0.4, optimal exposure conditions are hard to attain if pitch-to-size ratio of pattern in the photoresist layer is too small or pitch-to-size ratio varies too much across a photoresist layer. This is because when the pitch-to-size ratio is too small, interference caused by light passing through a narrow slit is greatly intensified. Therefore, the pattern is often distorted. In addition, when the pitch-to-size ratio is not uniformly spread, a single photomask can hardly satisfy all the pitch-to-size ratios scattered across the pattern. Hence, a portion of the pattern may be distorted or some micro features are erroneously transferred. In other words, processing window of lithographic operation is greatly lowered.

SUMMARY OF THE INVENTION

Accordingly, one object of the present invention is to provide a photomask set and a photolithographic operation capable of increasing the process window of a pattern transfer operation.

To achieve these and other advantages and in accordance with the purpose of the invention, as embodied and broadly described herein, the invention provides a photomask set. Each photomask in the set has a different pattern formed thereon. To transfer a complete pattern to a photoresist layer, each of the photomask is used in sequence. In other words, multiple light exposures are conducted instead of a single light exposure. Pitch-to-size ratio of the pattern on each photomask is greater than the pitch-to-size ratio of the intended pattern in the photoresist layer. Pitch-to-size ratios of the pattern on each photomask are roughly identical but differ from the pitch-to-size ratio of the intended pattern on the photoresist layer. In addition, various types of patterns including linear-shaped blocks, rectangular islands or even contact openings can be formed on the photomask.

In this invention, multiple exposures with each light exposure using a different photomask are used to form a single pattern on a photoresist layer. By breaking up a pattern transfer to a photoresist layer into multiple steps, pitch-to-size ratio of the pattern on each photomask can be increased or made roughly identical to each other. Hence, the process window of each photolithographic exposure is increased leading to a leap in the overall process window of pattern transfer to a photoresist layer.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
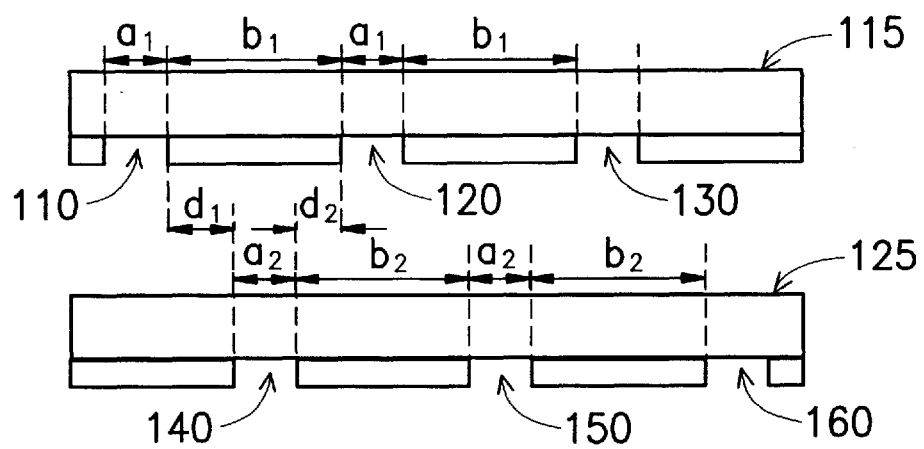
FIG. 1A is a cross-sectional side view showing a first and a second photomask each having a pattern with an identical pitch-to-size ratio used in exposing a photoresist layer according to one preferred embodiment of this invention.

Reference will now be made in detail to the present preferred embodiments of the invention, examples of which are illustrated in the accompanying drawings. Wherever possible, the same reference numbers are used in the drawings and the description to refer to the same or like parts.

To illustrate the embodiment of this invention, two photolithographic exposures are carried out each time using a photomask with a different pattern as shown in FIG. 1A.

Figure 1B:
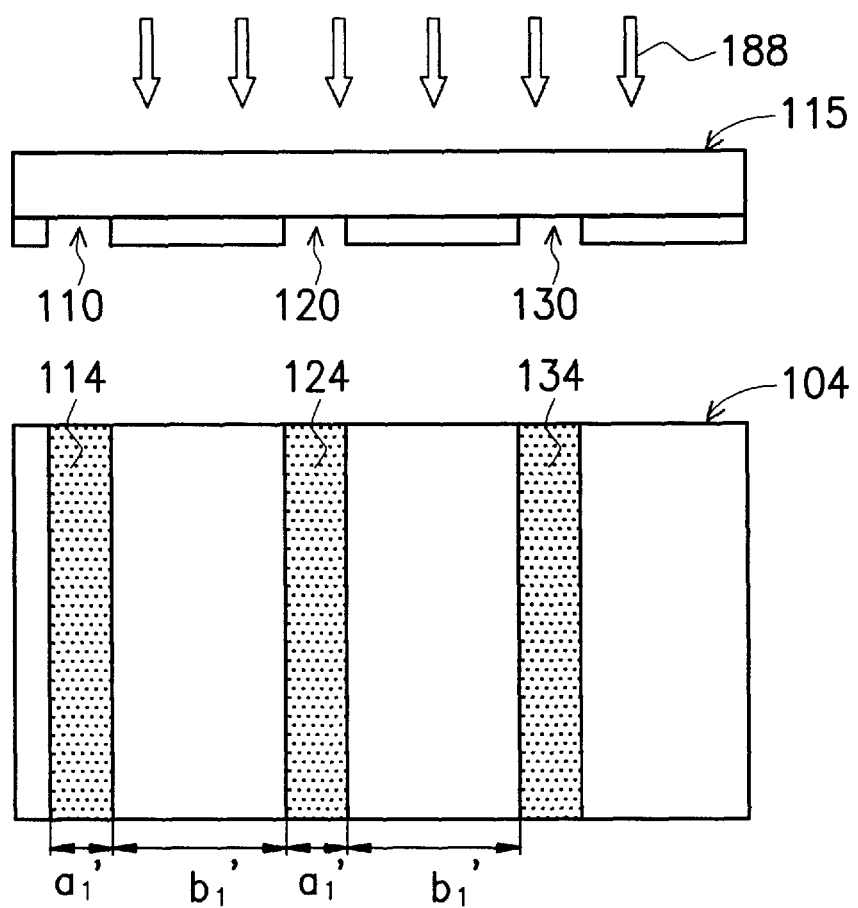
FIG. 1B is a schematic diagram showing a first exposure of a photoresist layer using the first photomask of this invention.
Figure 1C:
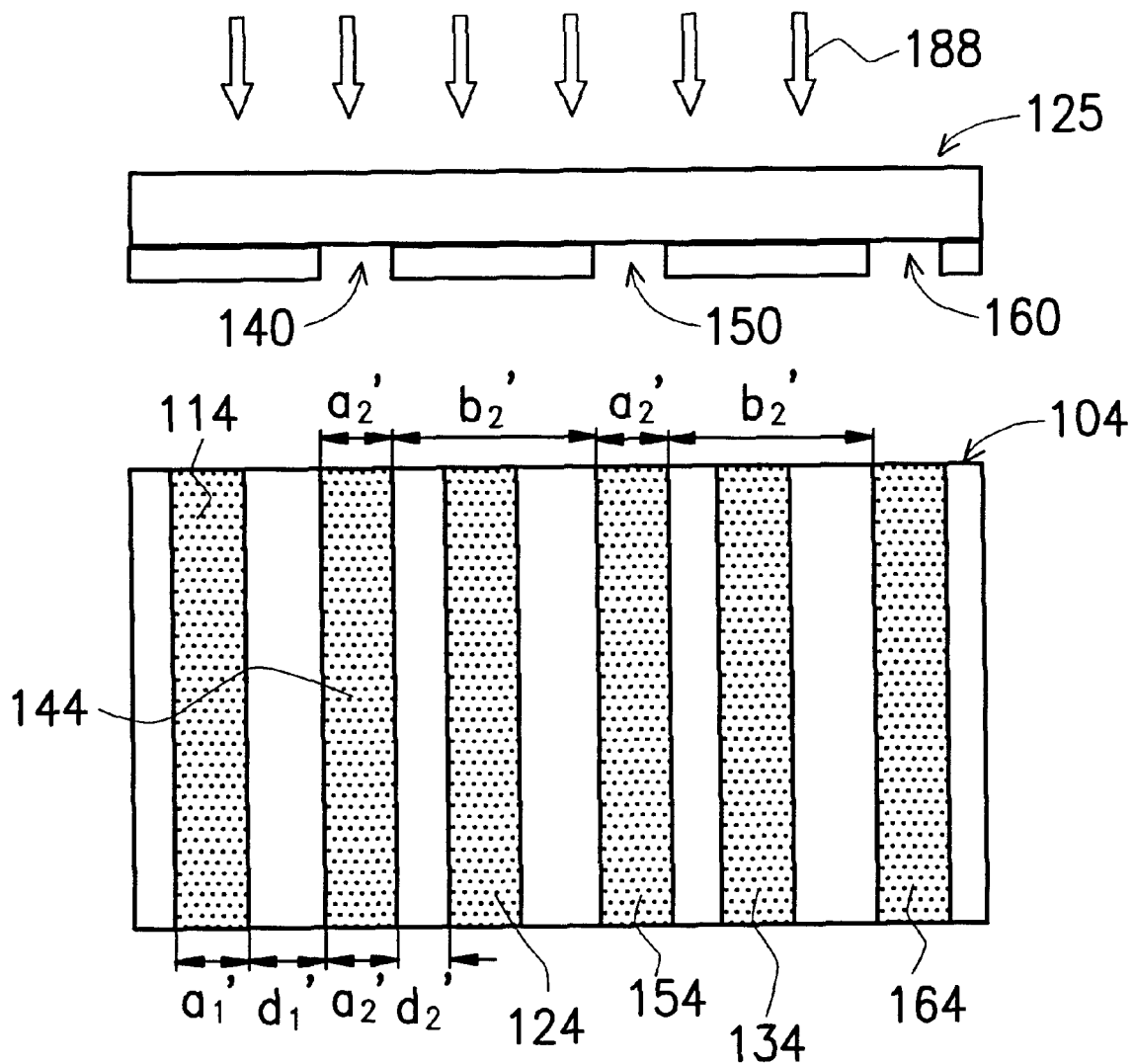
FIG. 1C is a schematic diagram showing a second exposure of the photoresist layer using the second photomask of this invention.

FIG. 1A is a cross-sectional side view showing a first and a second photomask each having a pattern with an identical pitch-to-size ratio used in exposing a photoresist layer according to one preferred embodiment of this invention. FIG. 1B is a schematic diagram showing a first exposure of a photoresist layer using the first photomask of this invention. FIG. 1C is a schematic diagram showing a second exposure of the photoresist layer using the second photomask of this invention. A first photomask 115 and a second photomask 125 (both having a pitch-to-size ratio greater than the overall pitch-to-size ratio of the final pattern on a photoresist layer) are used in two sequential photoexposures. Ultimately, a non-uniform pattern having a smaller pitch-to-size ratio is transferred to a photoresist layer 104. In FIG. 1A, width of opaque regions on the first photomask 115 are $b_1$ while width of the transparent regions 110, 120 and 130 on the first photomask 115 are $a_1$. Similarly, width of opaque regions on the second photomask 125 are $b_2$ while width of the transparent regions 140, 150 and 160 on the first photomask 115 are $a_1$. In general, width $b_1$ of all the opaque regions in the first photomask 115 and width $b_2$ of all the opaque regions in the second photomask 125 are identical. Similarly, width $a_1$ of all the transparent regions in the first photomask 115 and width $a_2$ of all the transparent regions in the second photomask 125 are also identical. The transparent regions 110, 120 and 130 of the first photomask 115 are shifted with respect to the transparent regions 140, 150 and 150 of the second photomask 125 so that the transparent regions take up alternate positions. For example, the transparent region 110 on photomask 115 is at a relative distance $d_1$ away from the transparent region 140 on photomask 125. However, the transparent region 140 on photomask 125 is at a relative distance $d_2$ away from the transparent region 120 on photomask 115, where distances $d_1$ and $d_2$ have different values in this example.

As shown in FIG. 1B, a beam light from a light source 188 shines on the photomask 115. A portion of the light is permitted to pass through the transparent regions 110, 120 and 130 to form exposed regions 114, 124 and 134 on the photoresist layer 104, respectively. A second light exposure is conducted as shown in FIG. 1C where a beam of light 188 shines on the photomask 125. A portion of the light is permitted to pass through the transparent regions 140, 150 and 160 to form exposed regions 144, 154 and 164 on the photoresist layer 104, respectively. Among the exposed regions 114–164 on the photoresist layer 104, exposed regions 114, 124 and 134 (shown in FIG. 1B) all have the same width $a_1'$ and are separated from each other by the same distance $b_1'$. Hence, the pattern on the photomask 115 has a large process window. Similarly, among the exposed regions 114–164, exposed regions 144, 154 and 164 (shown in FIG. 1C) all have the same width $a_2'$ and are separated from each other by the same distance $b_2'$. Hence, the pattern on the photomask 125 also has a large process window.

In FIG. 1C, the exposed region 114 and the exposed region 144 on the photoresist layer 104 are separated by a distance $d_1'$, while the exposed region 144 and the exposed region 124 are separated by $d_2'$. In general, the values $d_1'$ and $d_2'$ are smaller than the values $b_1'$ and $b_2'$ of the photomask 115 and 125, respectively. This is because the single pattern on the original photomask is split into separate photomask 115 and 125. Hence, by positioning the pattern onto two separate photomasks, two different photomasks each having an identical pitch-to-size ratio can be used to form an exposed pattern having a variable pitch-to-size ratio. In other words, two photomasks having a greater pitch-to-size ratios are used to form an exposed pattern having a smaller pitch-to-size ratio. Obviously, photomasks having identical pitch-to-size ratios have a photolithographic process window much greater than photomasks having different pitch-to-size ratios. Conversely, photomasks having greater pitch-to-size ratios have a greater photolithographic process window than photomasks having smaller pitch-to-size ratios. Therefore, this invention is capable of raising the process window of photolithographic operation.

Furthermore, to get closer to the intended pattern, different types of optical mask are often employed, for example, optical proximity correction (OPC) mask or phase shifting mask (PSM). In general, an optical proximity correction mask often has assistant bars, hammerhead, serifs and jogs while a phase shifting mask often includes an attenuated phase shifting mask or a rim phase shifting mask.

Figure 2A:
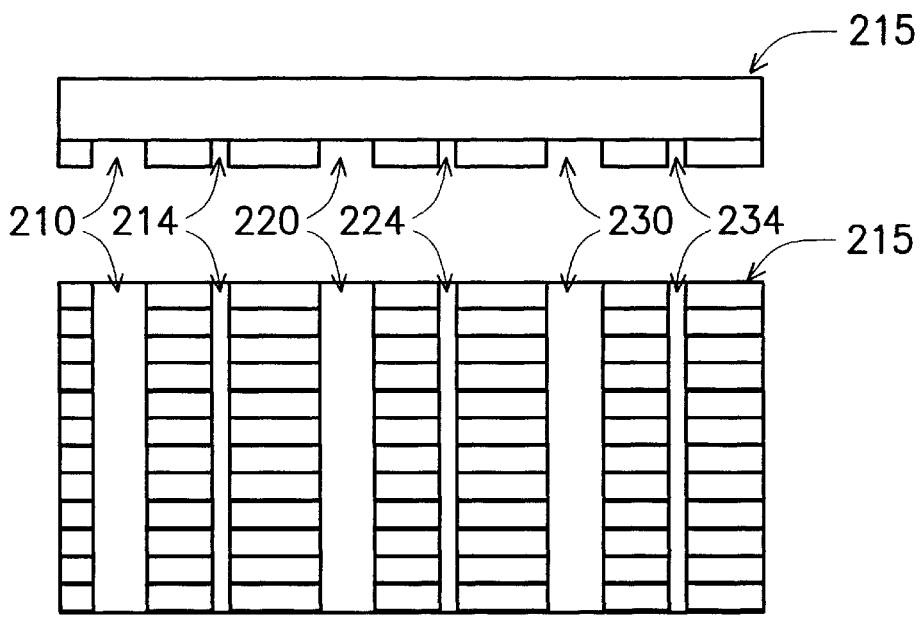
FIGS. 2A and 2B are schematic diagrams showing a cross-sectional side view and a top view of a first and a second photomask each having a pattern with an identical pitch-to-size ratio and assistant bars for optical proximity correction.
Figure 2B:
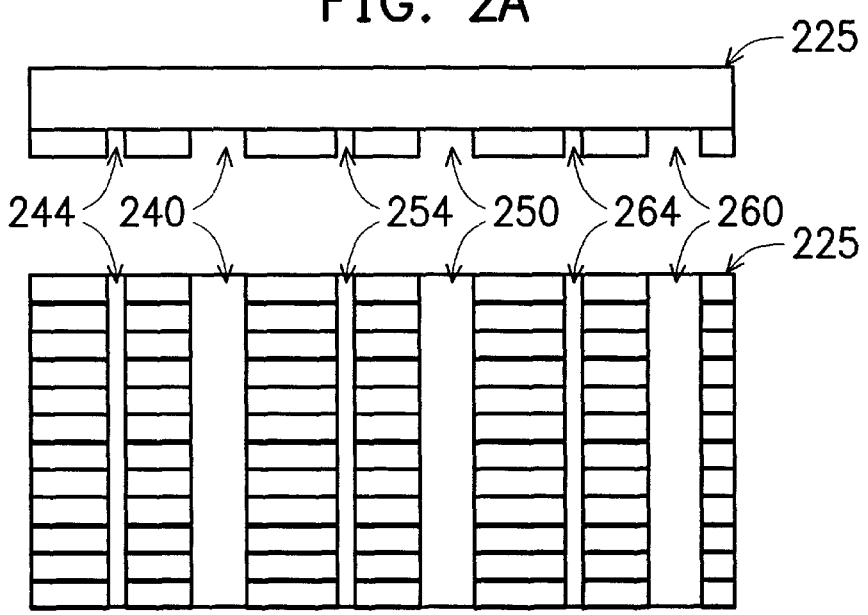

FIGS. 2A and 2B are schematic diagrams showing a cross-sectional side view and a top view of a first and a second photomask each having a pattern with an identical pitch-to-size ratio and assistant bars for optical proximity correction. The photomask 215 in FIG. 2A includes transparent regions 210, 220 and 230 for forming the main pattern. The photomask 215 also contains assistant bars 214, 224 and 234 for optical proximity correction. Similarly, the photomask 225 in FIG. 2B includes transparent regions 240, 250 and 260 for forming the main pattern. The photomask 225 contains additional assistant bars 244, 254 and 264 for optical proximity correction.

In the embodiment of this invention, the assistant bars for the photomask 215 and 225 are formed on the same photomask. In other words, the assistant bars 214, 224 and 234 on the photomask 215 provide the necessary optical proximity correction for transparent regions 210, 220 and 230 on the photomask 215. On the other hand, the assistant bars 244, 254 and 264 on the photomask 225 provide the necessary optical proximity correction for transparent regions 240, 250 and 260 on the photomask 225.

Figure 2C:
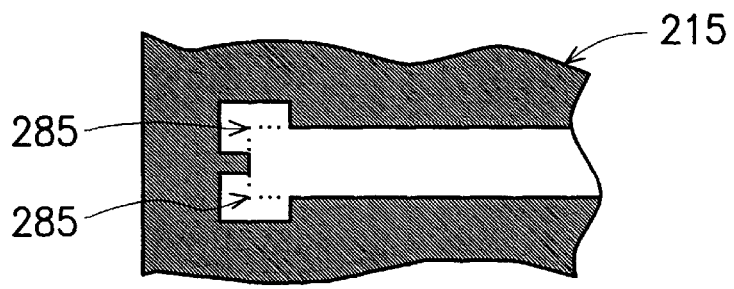
FIG. 2C is a schematic diagram showing a portion with serifs for optical proximity correction of a pattern according to this invention.

Serif patches are often added to an optical proximity correction mask as shown in FIG. 2C. In FIG. 2C, serif patches are formed at the corner regions 285 of a line pattern on the photomask 215. When the photomask 215 with the serif patches are used in photo-exposure, optical proximity correction is effected.

Figure 3A:
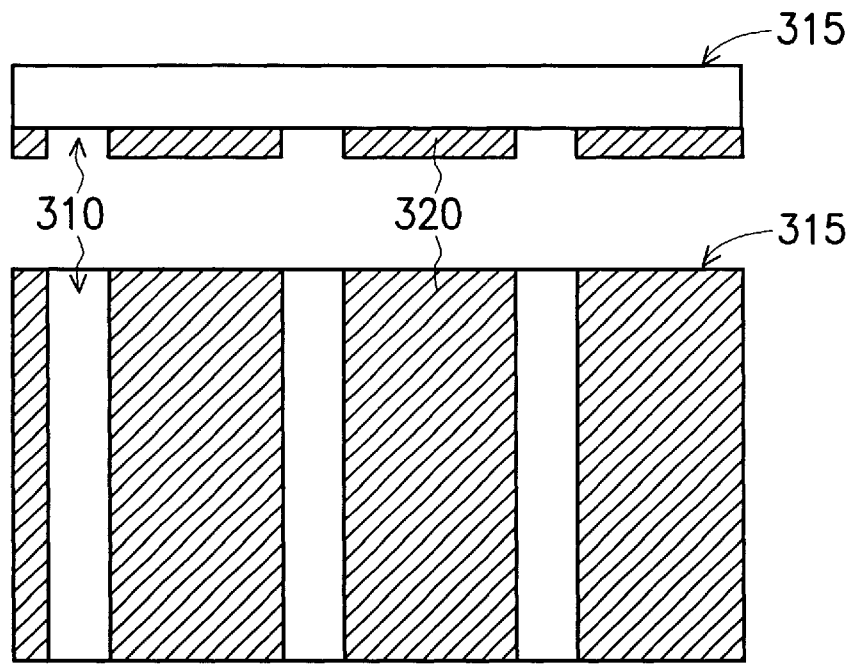
FIG. 3A is a schematic diagram showing a cross-sectional side view and a top view of an attenuated phase shifting mask according to this invention.
Figure 3B:
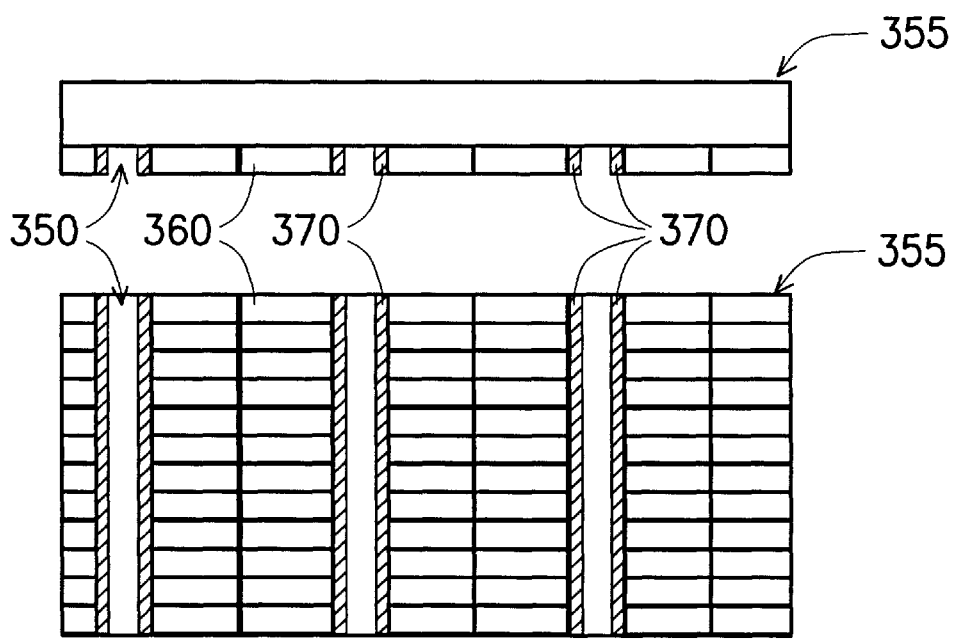
FIG. 3B is a schematic diagram showing a cross-sectional side view and a top view of a rim phase shifting mask according to this invention.

FIG. 3A is a schematic diagram showing a cross-sectional side view and a top view of an attenuated phase shifting mask. FIG. 3B is a schematic diagram showing a cross-sectional side view and a top view of a rim phase shifting mask. Note that since the pattern on the two photomasks in this invention varies similarly, only one of the photomasks is shown in FIGS. 3A and 3B.

In FIG. 3A, transparent regions 310 and semi-transparent regions 320 are alternately positions on the photomask 315. When the photomask 315 is used in a photo-exposure, light passing the semi-transparent regions 320 is attenuated and phase-shifted by 180° relative to the light passing the transparent regions 310. Consequently, the electromagnetic field outside the edge of the transparent regions 310 is eliminated through interference resulting in a high-quality exposed pattern on a photoresist layer.

In FIG. 3B, semi-transparent regions 370 are located at the edges of the opaque regions 360 on the rim phase shifting mask 355. When the photomask 355 is used in a photo-exposure, light passing through the semi-transparent regions 370 is attenuated and phase-shifted by 180° relative to the light passing through transparent regions 350. Consequently, electromagnetic field outside the edge of the transparent regions 350 is eliminated through interference resulting in a high-quality exposed pattern on a photoresist layer.

Using various optical proximity correction masks, attenuated phase shifting masks and rim phase shifting masks, process window and accuracy of photolithographic operation in this invention is further increased.

In this invention, a photomask having an identical pitch-to-size ratio but a different pattern is used in sequence in two separate photo-exposures to form an exposed pattern having different pitch-to-size ratios on a photoresist layer. Hence, a mask pattern having a suitable pitch-to-size ratio can be selected so that an optimal pattern is ultimately formed on a photoresist layer after photo-exposures. Because the process window of the pattern on each photomask used in photo-exposure can be individually adjusted, overall process window of the pattern-forming operation on the photoresist layer is increased.

Because a photomask having a larger pitch-to-size ratio pattern is used in the two photo-exposures to form a pattern on a photoresist layer having a smaller pitch-to-size ratio, interference between neighboring transparent regions is reduced to a minimum. Hence, quality of the exposed pattern is improved.

In addition, if the pitch-to-size ratio of a pattern is too small or the variation of pitch-to-size ratio across a pattern is too big, the pattern can be split into two or more patterns each having an identical pitch-to-size ratio. Hence, instead of just a single photo-exposure, multiple photo-exposures can be carried out, each using a photomask specially tailored to obtain optimal photo-exposure conditions.

Besides the linear shape pattern illustrated in the examples, this invention can also be applied to island-shaped pattern or contact opening pattern whose pitch-to-size ratio varies too much or whose pitch-to-size ratio itself is too small. Similarly, the island pattern or the contact opening pattern is split into several patterns each having identical but larger pitch-to-size ratio. The required pattern is then obtained by carrying out multiple exposures using each photomask in turn.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A photomask set, each photomask having a different pattern thereon so that a resulting pattern is formed on a photoresist layer after photo-exposures using each of the photomasks are carried out, wherein the resulting pattern on the photoresist layer has different pitch-to-size ratios and a pitch-to-size ratio of the pattern on each photomask is greater than at least one of the pitch-to-size ratios of the resulting pattern.

2. The photomask set of claim 1, wherein the pitch-to-size ratio of the pattern on each photomask is identical.

3. The photomask set of claim 1, wherein the photomask includes a plurality of phase shifting masks.

4. The photomask set of claim 3, wherein the phase shifting mask include a rim phase shifting mask.

5. The photomask set of claim 3, wherein the phase shifting mask includes an attenuated phase shifting mask.

6. The photomask set of claim 1, wherein the photomask includes a plurality of optical proximity correction masks.

7. The photomask set of claim 6, wherein the photomask with optical proximity correction includes assistant bars.

8. The photomask set of claim 6, wherein the photomask with optical proximity correction includes serif patches.

9. The photomask set of claim 1, wherein the pattern on the photomask includes linear-shaped blocks.

10. The photomask set of claim 1, wherein the pattern on the photomask includes contact opening blocks.

11. A photomask set for forming a desired pattern on a photoresist layer, wherein a pitch-to-size ratio of the desired pattern is different from a pitch-to-size ratio of the pattern on each photomask while the pitch-to-size ratio of each photomask in the set is identical, and the desired pattern is formed on a photoresist layer after performing photo-exposures using each photomask in turn.

12. The photomask set of claim 11, wherein the photomask includes a plurality of phase shifting masks.

13. The photomask set of claim 11, wherein the photomask includes a plurality of optical proximity correction masks.

14. The photomask set of claim 11, wherein pattern on the photomask includes linear-shaped blocks.

15. The photomask set of claim 11, wherein pattern on the photomask includes contact opening blocks.

* * * * *